United States Patent
Kitada et al.

(10) Patent No.: US 7,974,104 B2
(45) Date of Patent: Jul. 5, 2011

(54) PRINTED WIRING BOARD AND CONNECTION CONFIGURATION OF THE SAME

(75) Inventors: Tomofumi Kitada, Sakura (JP); Hiroki Maruo, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 12/577,867

(22) Filed: Oct. 13, 2009

(65) Prior Publication Data

US 2010/0027229 A1    Feb. 4, 2010

Related U.S. Application Data

(63) Continuation of application No. 11/676,213, filed on Feb. 16, 2007.

(30) Foreign Application Priority Data

Feb. 17, 2006    (JP) .................................. 2006-040894

(51) Int. Cl.
H05K 7/00 (2006.01)

(52) U.S. Cl. ........ 361/777; 361/749; 361/760; 361/771; 361/793; 174/254; 174/255; 174/256; 174/259; 174/261; 257/678; 257/782

(58) Field of Classification Search ............ 361/777, 361/749, 760, 771, 793; 174/254–256, 259, 174/261; 257/678, 782
See application file for complete search history.

(56) References Cited

U.S. PATENT DOCUMENTS

| | | | |
|---|---|---|---|
| 5,374,469 A | 12/1994 | Hino et al. | |
| 5,381,030 A | 1/1995 | Kasai | |
| 5,391,874 A | 2/1995 | Ellis | |
| 5,488,542 A | 1/1996 | Ito | |
| 5,793,150 A * | 8/1998 | Kober et al. | 310/338 |
| 6,081,036 A | 6/2000 | Hirano et al. | |
| 6,384,339 B1 * | 5/2002 | Neuman | 174/254 |
| 6,591,491 B2 | 7/2003 | Fujii et al. | |
| 6,797,888 B2 | 9/2004 | Ookawa et al. | |
| 7,080,445 B2 * | 7/2006 | Miyake et al. | 29/830 |
| 7,235,745 B2 | 6/2007 | Dass et al. | |
| 7,312,520 B2 | 12/2007 | Furuyama et al. | |
| 2002/0004180 A1 | 1/2002 | Hotta et al. | |
| 2002/0046880 A1 | 4/2002 | Takubo et al. | |
| 2002/0197834 A1 | 12/2002 | Asakawa et al. | |
| 2003/0087037 A1 * | 5/2003 | Honda et al. | 427/404 |
| 2003/0098339 A1 * | 5/2003 | Totani et al. | 228/175 |
| 2003/0106037 A1 | 6/2003 | Moniwa et al. | |
| 2004/0009683 A1 | 1/2004 | Hiraoka et al. | |
| 2004/0036833 A1 | 2/2004 | Monzen | |
| 2004/0075157 A1 | 4/2004 | Konishi et al. | |

(Continued)

FOREIGN PATENT DOCUMENTS

CN    1717147 A    1/2006

(Continued)

*Primary Examiner* — Xiaoliang Chen

(74) *Attorney, Agent, or Firm* — Sughrue Mion, PLLC

(57) ABSTRACT

A printed wiring board having an insulating base material; a wiring formed on at least one surface of the insulating base material, the wiring forming a predetermined circuit pattern; a first connection terminal portion formed on the surface and electrically connected to the wiring, the first connection terminal portion having a first width; a second connection terminal portion formed on the surface and electrically connected to the wiring, the second connection terminal portion having a second width; and a cover layer configured to cover the wiring and expose the first and the second connection terminal portion.

11 Claims, 6 Drawing Sheets

U.S. PATENT DOCUMENTS

| | | | |
|---|---|---|---|
| 2004/0081751 A1* | 4/2004 | Nakanishi et al. | 427/108 |
| 2004/0173891 A1 | 9/2004 | Imai et al. | |
| 2005/0057906 A1 | 3/2005 | Nakatani et al. | |
| 2005/0162484 A1 | 7/2005 | Isono | |
| 2005/0184381 A1 | 8/2005 | Asahi et al. | |
| 2005/0243528 A1* | 11/2005 | Murayama | 361/760 |
| 2005/0272276 A1* | 12/2005 | Ooyabu | 439/35 |
| 2006/0055021 A1 | 3/2006 | Yamamoto | |
| 2006/0151863 A1 | 7/2006 | Das et al. | |
| 2006/0154434 A1 | 7/2006 | Das et al. | |
| 2006/0154501 A1 | 7/2006 | Das et al. | |
| 2006/0169485 A1 | 8/2006 | Kawaguchi et al. | |
| 2006/0192278 A1 | 8/2006 | Furuyama et al. | |
| 2006/0226200 A1* | 10/2006 | Banno et al. | 228/101 |
| 2006/0244177 A1 | 11/2006 | Kaneto et al. | |
| 2006/0244741 A1* | 11/2006 | Kimura et al. | 345/204 |
| 2006/0268530 A1 | 11/2006 | Nagao et al. | |
| 2007/0000685 A1* | 1/2007 | Inoue | 174/255 |
| 2007/0010065 A1 | 1/2007 | Das et al. | |
| 2007/0138613 A1* | 6/2007 | Matsumoto et al. | 257/678 |
| 2007/0217202 A1 | 9/2007 | Sato | |
| 2007/0273045 A1* | 11/2007 | Kitada et al. | 257/782 |

FOREIGN PATENT DOCUMENTS

| | | |
|---|---|---|
| JP | 2797971 B2 | 7/1998 |
| JP | 2800691 B2 | 7/1998 |
| KR | 2004-0101000 A | 12/2004 |

* cited by examiner

PRINTED WIRING BOARD AND CONNECTION CONFIGURATION OF THE SAME

This is a Continuation of application Ser. No. 11/676,213 filed Feb. 16, 2007. The entire disclosure of the prior application, application Ser. No. 11/676,213 is hereby incorporated by reference. This application claims priority under 35 U.S.C. §119 to Japanese Patent Application No. 2006-040894, filed on Feb. 17, 2006, the entire contents of which are incorporated by reference herein.

BACKGROUND

The present invention relates to a printed wiring board for use in various electrical apparatuses and a connection configuration of the same. Specifically, the present invention relates to a printed wiring board including a terminal portion to be connected by use of solder and its connection configuration.

DESCRIPTION OF THE RELATED ART

There has been known a soldering connection as one example of a method of connecting a substrate flexible enough to be foldable with a rigid substrate, or connecting two flexible substrates. There will be briefly explained a related-art connection portion in which a flexible substrate 101 and a rigid substrate 105 are connected with each other using a solder, referring to FIGS. 1 and 2.

The flexible substrate 101 is composed by stacking an insulating film base material 102 made of an insulating material such as polyimide, polyester or the like, a wiring pattern 103 made of copper (Cu), silver (Ag) or the like allowing for an electric current or signal transmission therethrough, and an insulating cover layer 104 formed on the wiring patterns 103 and the base material 102 for protection purpose. The flexible substrate 101 has a connection portion to be used for connection with the rigid substrate 105. The connection portion is not covered by the cover layer 104, and thus the wiring pattern (connection terminal portion) 103 is exposed to view.

The rigid substrate 105 is composed, similarly with the flexible substrate 101, of an insulating base material 106, a wiring pattern 107 made of an electrically conductive material, and an insulating resist layer 108 for protecting the wiring pattern 107. The rigid substrate 105 has a connection portion to be used for connection with the flexible substrate 101. The connection portion is not covered by the resist layer 108, and thus the wiring pattern 107 is exposed to view.

The wiring pattern 103 and the wiring pattern 107 are connected via a solder 109 provided on the wiring pattern 103 or the wiring pattern 107 as shown in FIGS. 1 and 2, thereby securing an electrical communication therebetween.

The connection portion between the substrates mentioned above is subjected to various kinds of stress such as tensile stress, peel-off stress, or the like. Therefore, the connection portion that connects the rigid substrate 105 and the flexible substrate 102, or the wiring patterns, has to have connection strength sufficient to withstand such stress. In addition, care should be exercised on not only strength between the wiring patterns connected via a solder but also tolerance for peeling off of the wiring patterns from the film base material constituting the flexible substrate or the rigid substrate.

In order to enhance the connection strength between the wiring pattern (connection terminal portion) and the base material, it has long been believed that the two substrates to be connected have a sufficient wire width and wire separation in a permissible range for insulation, as in the related-art connection configuration shown in FIGS. 1 and 2. Even if the requirement is met, however, when the wiring patterns have an identical wire width as in the configuration shown in FIG. 2, there is no room for a solder pool. Therefore, there is required a strict control of an amount of solder paste or plating solder. However, it is generally difficult to control a feeding amount of solder. Furthermore, since pressure is applied to the solder by a heater chip or the like in a soldering process, short-circuit is caused rather highly frequently between wires by redundant solder. As a technique to overcome such a disadvantage and realize a sufficient connection strength, a connection configuration shown in FIG. 3 has been proposed (for example, see Japanese Patent Publication No. 2800691).

In the connection configuration shown in FIG. 3, a connection land (connection portion) 203, formed on a base material 202 of one substrate 201, has a narrower width than a connection land 206 formed on a base material 205 of the other substrate 204. According to this configuration, there is promoted a formation of fillet that serves as a solder pool when both substrates are connected via a solder 207, thereby preventing short-circuit due to redundant solder.

As a similar example, there has been proposed a technique directed to prevent short-circuit and enhance a connection strength between a flexible substrate and a circuit substrate (see, Japanese Patent Publication No. 279191). In this technique, the flexible substrate and the circuit substrate are connected by fitting a connection land formed on the flexible substrate into an opening guide formed in the circuit substrate, the guide being formed wider than the connection land in a position opposing the connection land.

SUMMARY OF THE INVENTION

On the other hand, there is required in a substrate connecting technology an area saving of a connection portion due to a demand for miniaturization of an electric appliance, in addition to an enhancement of the connection strength between the substrates. The connection configurations disclosed in the above publications emphasize a narrower wire width formed on one of the two substrates to be connected, mainly in view of promoting a fillet and enhancing the connection strength between the wiring pattern and the film base material. Although it is possible to make a wire separation narrower within a permissible range for insulation in order to reduce the connection area in such a configuration where a width of the wiring pattern (connection terminal) needs to be reduced, there exists a restriction which hinders further reduction of the area if the other substrate to be connected has a wider wiring pattern (connection terminal portion).

The present invention has been made in view of the above circumstances and an aspect of the present invention is to provide a printed wiring board that is capable of further reducing a terminal wiring separation in a connection terminal portion and thus preventing short-circuit due to solder bridging, and a connection configuration of the same.

A first aspect of the present invention provides a printed wiring board having an insulating base material, a wiring formed on at least one surface of the insulating base material, the wiring forming a predetermined circuit pattern, a first connection terminal portion formed on the surface and electrically connected to the wiring, the first connection terminal portion having a first width, a second connection terminal portion formed on the surface and electrically connected to the wiring, the second connection terminal portion having a second width, and a cover layer configured to cover the wiring and expose the first and the second connection terminal portion.

Since the printed wiring board according to the first aspect of the present invention has the first and the second connection terminal portion which each have a different width, there is reduced a total breadth of the connection terminal area that includes a width of the connection terminal portions formed in the printed wiring board and a separation between the connection terminal portions, in comparison with where only a connection terminal portion having one width is formed.

A second aspect of the present invention provides a printed wiring board according to the first aspect, wherein the first connection terminal portion is formed alternately with the second connection terminal portion, which allows for a further reduction of the separation between the connection terminal portions.

A third aspect of the present invention provides a printed wiring board according to the first aspect, where a plurality of the first connection terminal portions are formed alternately with a plurality of the second connection terminal portions, which is applied to a differential communication line.

A fourth aspect of the present invention provides a connection configuration directed to a first printed wiring board and a second printed wiring board. The first printed wiring board includes a first insulating base material, a first wiring formed on at least one surface of the insulating base material, the first wiring forming a predetermined circuit pattern, a first connection terminal portion formed on the surface and electrically connected to the first wiring, the first connection terminal portion having a first width, a second connection terminal portion formed on the surface and electrically connected to the first wiring, the second connection terminal portion having a second width and a first cover layer configured to cover the wiring and expose the first and the second connection terminal portion. The second printed wiring board includes a second insulating base material, a second wiring formed on at least one surface of the insulating base material, the second wiring forming a predetermined circuit pattern, a third connection terminal portion formed on the surface and electrically connected to the second wiring, the third connection terminal portion having a third width and being formed so as to oppose the second connection terminal portion, a fourth connection terminal portion formed on the surface and electrically connected to the second wiring, the fourth connection terminal portion having a fourth width and being formed so as to oppose the first connection terminal portion, and a second cover layer configured to cover the wiring and expose the third and the fourth connection terminal portion. In this connection configuration, the first connection terminal portion is connected to the fourth connection terminal portion with a solder layer provided therebetween and the second connection terminal portion is connected to the third connection terminal portion with a solder layer provided therebetween.

According to the fourth aspect of the present invention, since the connection terminal portions having each a different width are formed in combination on each insulating base material, there is reduced a total breadth of the connection terminal area that includes a width of the connection terminal portions and a separation between the connection terminal portions, in comparison with where only a connection terminal portion having one width is formed.

A fifth aspect of the present invention provides a connection configuration according to the fourth aspect, where the first width is substantially the same as the fourth width and the second width is substantially the same as the third width.

In such a connection configuration, since the connection terminal portions to be mutually connected have a different width, there is formed a fillet serving as a solder pool, thereby preventing short-circuit that may take place due to redundant solder and enhancing a connection strength.

A sixth aspect of the present invention provides the connection configuration according to the fourth aspect, where the first connection terminal portion is formed alternately with the second connection terminal portion. According to this connection configuration, there is reduced a total breadth of the connection terminal area that includes a width of the connection terminal portions and a separation between the connection terminal portions, in comparison with where one printed wiring board has only a connection terminal portion having a narrow width and the other printed wiring board has only a connection terminal portion having a large width.

A seventh aspect of the present invention provides a connection configuration according to the fourth aspect, where a plurality of the first connection terminal portions are formed alternately with a plurality of the second connection terminal portions. This configuration is preferably applied to a differential communication line.

An eighth aspect of the present invention provides a connection configuration according to any one of the fourth to the seventh aspect, where at least one of the pair of the printed wiring boards has flexibility.

According to the non-limiting embodiments of the present invention, one of the two printed wiring boards has the first connection terminal portion having the first width and the second connection terminal portion having the second width narrower than the first width, wherein the first connection terminal portion is arranged so as to oppose a connection terminal portion having a narrower width formed on the other printed wiring board and the second connection terminal portion is arranged so as to oppose a connection terminal portion having a wider width formed on the other printed wiring board, thereby reducing a wiring pitch, in comparison with a situation where a narrower connection terminal portion is formed only on one of printed wiring boards and a wider connection terminal portion is formed only on the other printed wiring board.

Moreover, when these substrates are connected with the solder layer, a difference in terminal width promotes a formation of a fillet serving as solder pool, thereby preventing solder bridging from taking place and thus short-circuit.

DETAILED DESCRIPTION OF EXEMPLARY EMBODIMENTS OF THE INVENTION

Non-limiting, exemplary embodiments of the present invention will now be described with reference to the accompanying drawings. It should be noted that the accompanying drawings, whether alone or thereamong, are not to scale but merely schematic representations and are not intended to portray the specific parameters or structural details of the invention, which should be determined by a person having ordinary skill in the art through the following description herein.

Figure 4:
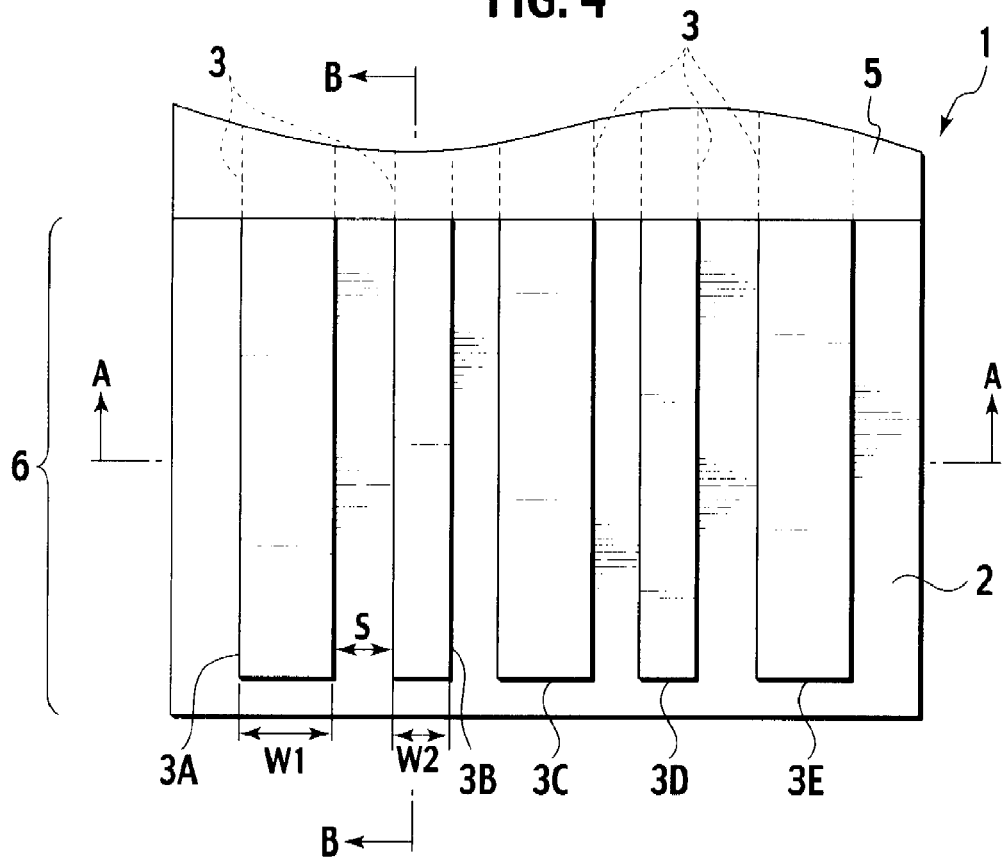
FIG. 4 is a plan view of a substantial portion of a printed wiring board exemplified as one embodiment of the present invention.
Figure 5:
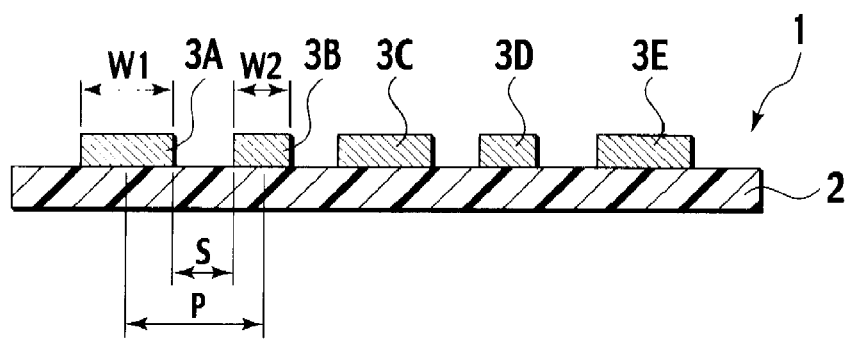
FIG. 5 is a cross-sectional view taken along a line A-A of the printed wiring board shown in FIG. 4.
Figure 6:
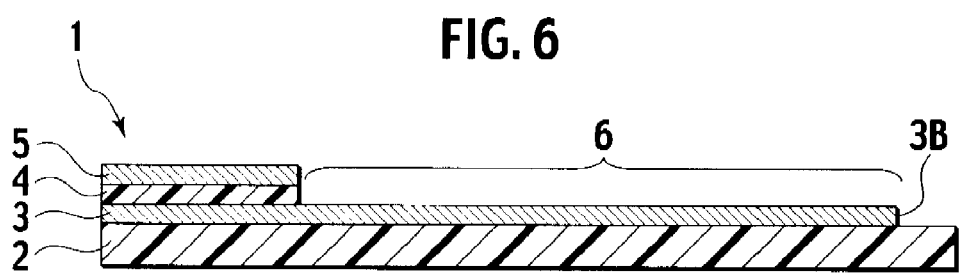
FIG. 6 is a cross-sectional view taken along a line B-B of the printed wiring board shown in FIG. 4.

FIGS. 4 to 5 illustrate a printed wiring board 1 according to a first non-limiting embodiment. Specifically, FIG. 4 is a plan view of a substantial portion of the printed wiring board 1; FIG. 5 is a cross-sectional view taken along a line A-A in FIG. 4; and FIG. 6 is a cross-sectional view taken along a line B-B in FIG. 4.

The printed wiring board 1 is generally composed of an insulating base material 2, a plurality of wirings 3 formed so as to have a predetermined pattern on at least one surface of the insulating base material 2, and a resist layer 5 as a cover layer covering the wirings 3. Extending from the wirings 3, connection terminal portions 3A to 3E are provided exposed, which serve to electrically connect the printed wiring board 1 to a mating printed wiring board. The connection terminal portions 3A, 3C, 3E, among those 3A to 3E, are formed on the same surface of the insulating base material 2 so as to have a first width W1 along a direction perpendicular to an extending direction of the connection terminal portions, that is, a width direction of the portions. The connection terminal portions 3B, 3D are formed on the same surface so as to have a second width W2 shorter than the first width W1. In this embodiment, the connection terminal portions 3A, 3C, 3E having the first width W1 are arranged alternately with the connection terminal portions 3B, 3D having the second width W2 on the surface of the insulating base material 2, respectively.

The insulating base material 2 is made of a flexible material such as polyimide resin, liquid crystal polymer or the like, and thus a so-called flexible substrate.

The wirings 3 are formed by patterning a copper foil adhered on the insulating base material 2 employing for example a subtracting method. As an adhesion layer 4 that adheres the resist layer 5 thereon, a various type of resin adhesives can be used. The adhesive may include polyimide, epoxy, olefin adhesives or the like. As the resist layer 5, polyimide resin can be used as is used for the insulating base material 2.

Figure 1:
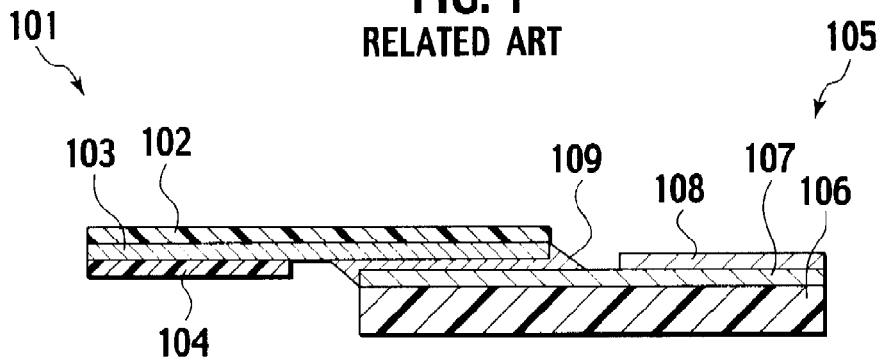
FIG. 1 is a vertical cross-sectional view of a related art printed wiring board.
Figure 2:
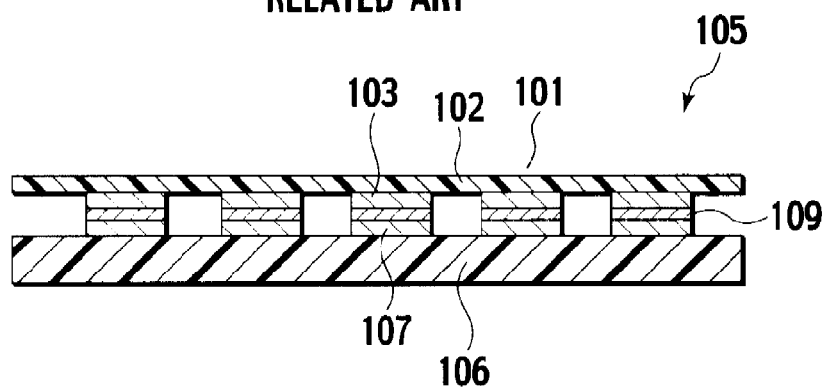
FIG. 2 is a horizontal cross-sectional view of a related art printed wiring board.

The printed wiring board 1 is provided with a connection area 6 in a predetermined end portion of the insulating base material 2. In the connection area 6, the connection terminal portions 3A to 3E extending from at least a part of the plurality of the wirings 3 are exposed. As shown in FIGS. 1 and 2, the connection terminal portions 3A, 3C, 3E each have the first width W1 and the connection terminal portions 3B, 3D each have the second width W2. The connection terminal portions 3A to 3E are arranged parallel with one another in substantially the same separation S and substantially the same pitch P (FIG. 5). The separation S is determined so that an electric communication is reliably established without any short-circuits taking place between the connection terminal portions 3A to 3E, which are connected with each other employing a plating solder layer therebetween (described later).

When the printed wiring board 1 having the above configuration is soldered with a mating printed wiring board, it is preferable to provide a plating solder layer on a surface of the connection terminal portion of at lease either one of the printed wiring boards and thus to carry out soldering.

Figure 7:
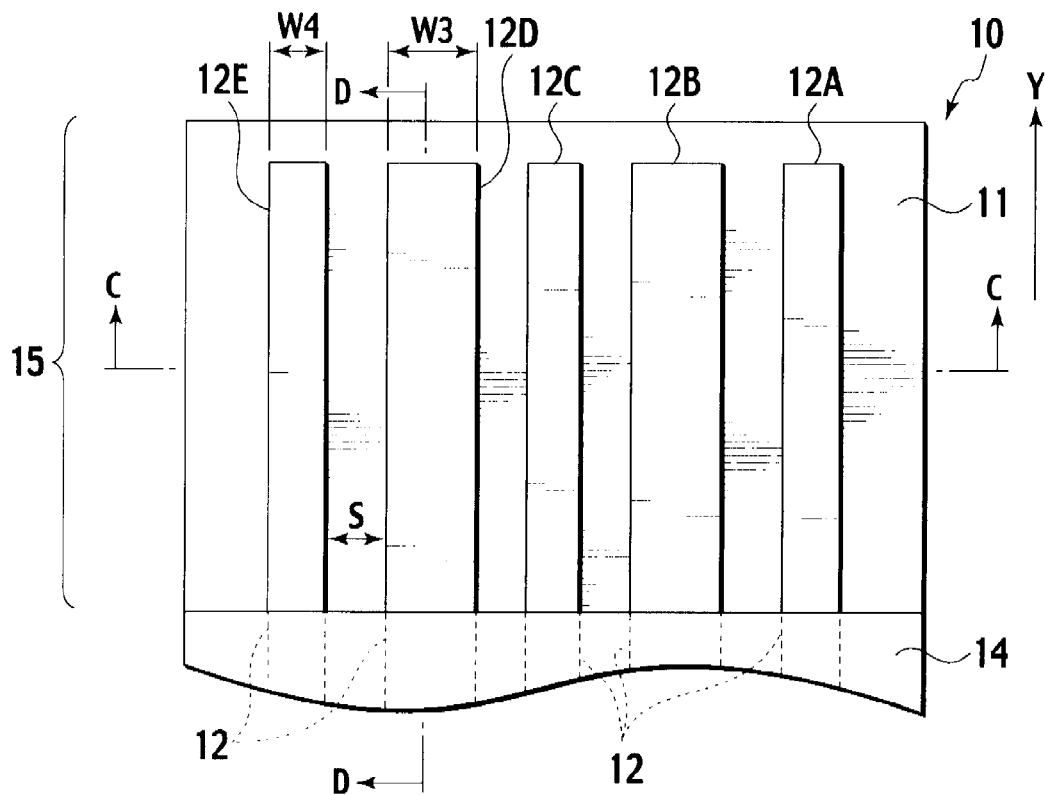
FIG. 7 is a plan view of a substantial portion of a flexible substrate to be connected with the printed wiring board shown in FIG. 4.
Figure 8:
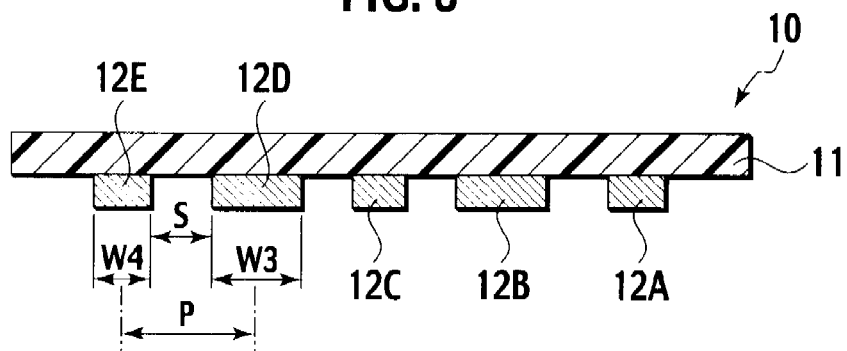
FIG. 8 is a cross-sectional view taken along a line C-C of the printed wiring board shown in FIG. 7.
Figure 9:
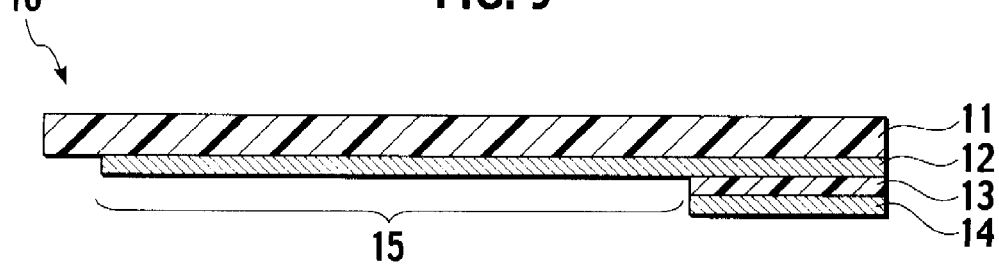
FIG. 9 is a cross-sectional view taken along a line D-D of the printed wiring board shown in FIG. 7.
Figure 10:
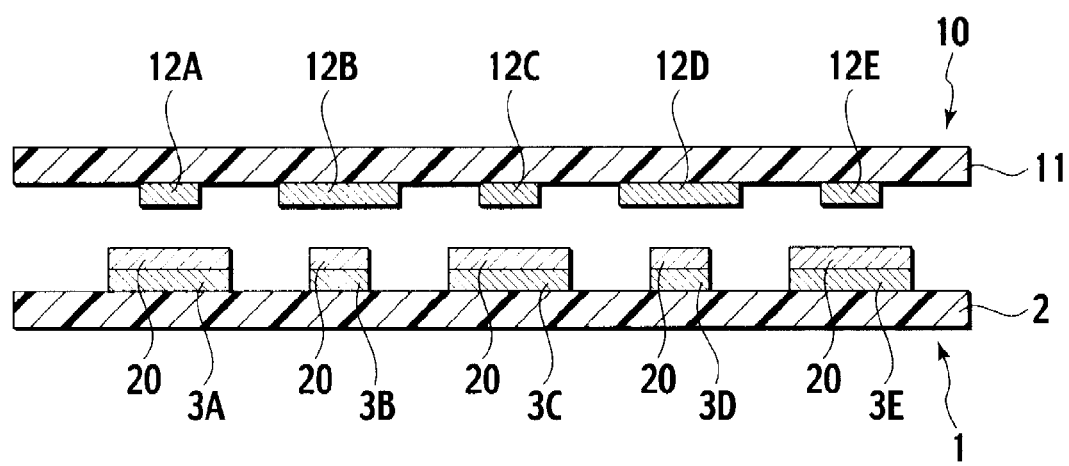
FIG. 10 is a cross-sectional view taken along a line C-C of the printed wiring board shown in FIG. 4, illustrating where a plating solder layer is formed on a surface of a connection terminal portion.
Figure 11:
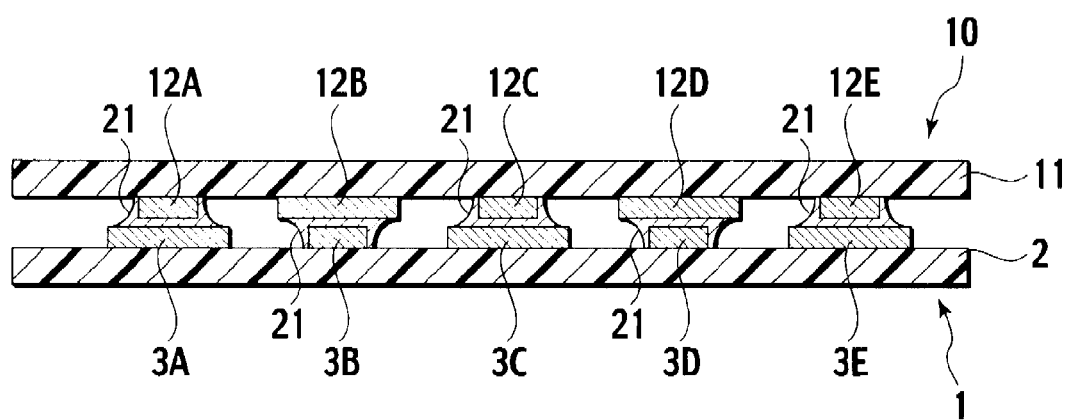
FIG. 11 is a cross-sectional view taken along a line C-C in FIG. 7, illustrating a connection configuration between the printed wiring board and the flexible substrate.

Referring to FIGS. 7 to 11, there will be described a connection configuration of the printed wiring board according to this non-limiting embodiment. FIGS. 7 to 10 show a connection configuration of a printed wiring board 10 that is to be connected to the printed wiring board 1 according to this embodiment. Specifically, FIG. 7 is a plan view of a substantial portion of the printed wiring board; FIG. 8 is a cross-sectional view taken along a line C-C in FIG. 7; and FIG. 9 is a cross-sectional view taken along a line D-D in FIG. 7. In addition, FIG. 10 illustrates where a plating solder layer is formed on the connection terminal portion of the printed wiring board 1. FIG. 11 is a cross-sectional view taken along a line C-C in FIG. 7, illustrating the connection configuration after the printed wiring boards 1, 10 are soldered with each other.

In this connection configuration according to this embodiment, the above-mentioned flexible printed wiring board 1 is soldered with the printed wiring board 10 (detailed later). The printed wiring board 10 is generally composed of an insulating base material 11, a plurality of wirings 12 formed so as to have a predetermined pattern on at least one surface of the insulating base material 11, an adhesion layer 13 formed on the insulating base material 11 having the plurality of wirings 12 thereon, and a resist layer (cover layer) 14 formed on the adhesion layer 13. Extending from the wirings 12, connection terminal portions 12A to 12E are provided exposed.

The insulating base material 11 is made of a prepreg such as glass epoxy resin or the like, and thus a so-called rigid substrate. The wirings 12 are formed by patterning a copper foil adhered on the insulating base material 11, employing for example a subtracting method. As the adhesion layer 13, there can be used various types of resin adhesives such as polyimide, epoxy, olefin adhesives or the like. As the resist layer 14, polyimide resin or the like can be used.

The printed wiring board 10 is provided with a connection area 15 in a predetermined end portion of the insulating base material 11. In the connection area 15, connection terminal portions 12A to 12E, extending from at least a part of the plurality of the wirings 12, are exposed. As shown in FIG. 7, the connection terminal portions 12B, 12D each are formed so as to have a third width W3 in a width direction perpendicular to an extending direction Y of the wirings; and the connection terminal portions 12A, 12C, 12E each are formed so as to have a fourth width W4 narrower than the third width W3. The connection terminal portions 12A to 12E are arranged parallel with one another in substantially the same separation S and substantially the same pitch P (FIG. 8). The separation S is determined so that an electric communication is reliably established without any short-circuits taking place between the connection terminal portions, which are connected with each other employing a plating solder layer therebetween (described later).

In this non-limiting embodiment, the third width W3 is the same as the first width W1; and the fourth width W4 is the same as the second width W2. In addition, in the printed wiring board 10, the connection terminal portions 12B, 12D having the third width W3 (=W1) are formed in a position opposing the connection terminal portions 3B, 3D to be connected therewith of the printed wiring board 1; and the connection terminal portions 12A, 12C, 12E having the fourth width W4 (=W2) are formed in a position opposing the connection terminal portions 3A, 3C, 3E. FIGS. 4 and 7 illustrate where the connection terminal portions having the third width W3 are arranged respectively alternately with the connection terminal portions having the fourth width W4.

In order to electrically connect the printed wiring board 1 with the printed wiring board 10 mentioned above, a plating solder layer 20 is formed in a surface of at least one of the connection terminal areas 6, 15 as shown in FIG. 10, and thus soldering is carried out while applying a predetermined pressure at a predetermined temperature. In FIG. 10, the plating solder layer 20 is formed on the surface of the connection terminal portion of the printed wiring board 1. This soldering allows for connection between the connection terminal portions 3A to 3E and the connection terminal portions 12A to 12E, respectively, thereby connecting the printed wiring board 1 and the printed wiring board 10.

According to the connection configuration according to this non-limiting embodiment of the present invention, since the wider connection terminal portions are provided respectively alternately with the narrower connection terminal portions in each printed wiring board, a terminal separation and pitch can be reduced down, in comparison with where a printed wiring board having constantly wide connection terminal portions is connected with a printed wiring board having constantly narrow connection terminal portions. Moreover, since the connection terminal portion 3A has a different terminal width from the connection terminal portion 12A in the connection configuration according to this embodiment, there is formed a fillet 21 around where the connection terminal portion 3A meets the connection terminal portion 12A, as shown in FIG. 11. The fillet 21 serves as a solder pool for redundant solder, thereby preventing a formation of a solder bridge and thus a short-circuit defect. The same effect holds true for the connection terminal portions 3B and 12B, 3C and 12C, 3D and 12D, and 3E and 12E.

The previous non-limiting embodiment has a connection terminal portion having the first width W1 and the terminal connection portion having the second width W2, which is shorter than the first width W1, provided alternately with each other on at least one surface of the insulating base material of the printed wiring board. However, an arrangement of the terminal portions, each a different width, is not limited to that in the previous embodiment. For example, a group of the terminal connections having the first width and a group of the terminal connections having the second width can be provided alternately with each other on at least one surface of the insulating base material. In this case, an opposing printed wiring board subjected to connection has to have a connection terminal portion having the fourth width in a position opposing the connection terminal portion having the first width and a connection terminal portion having the third width in a position opposing the connection terminal portion having the second width.

Figure 12:
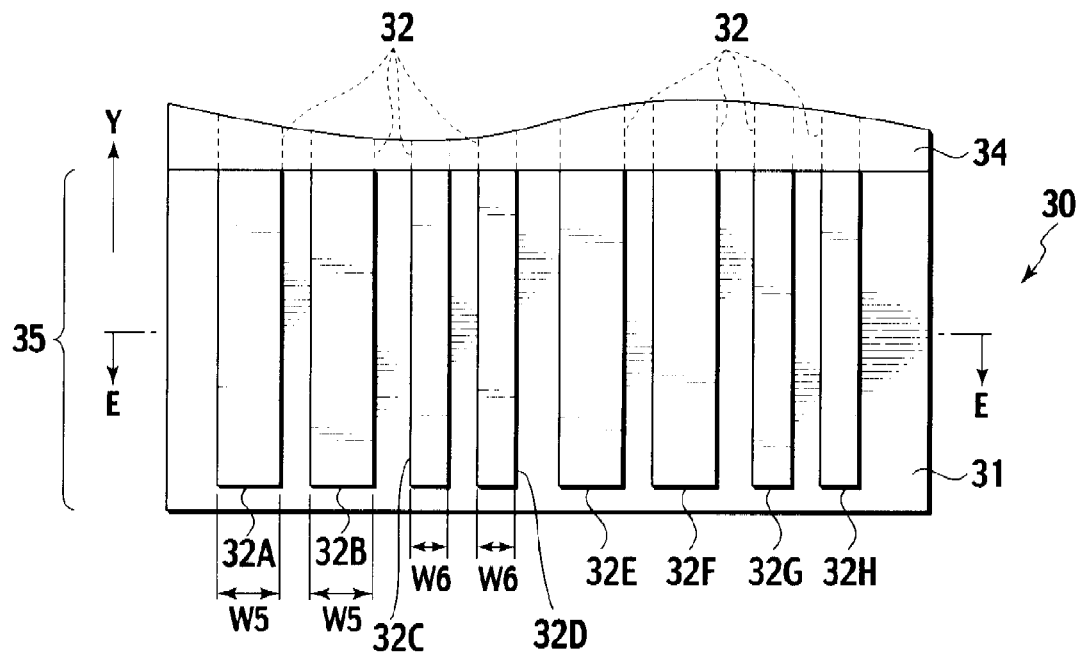
FIG. 12 is a plan view of a substantial portion of another connection configuration for a printed wiring board exemplified as another embodiment of the present invention.
Figure 13:
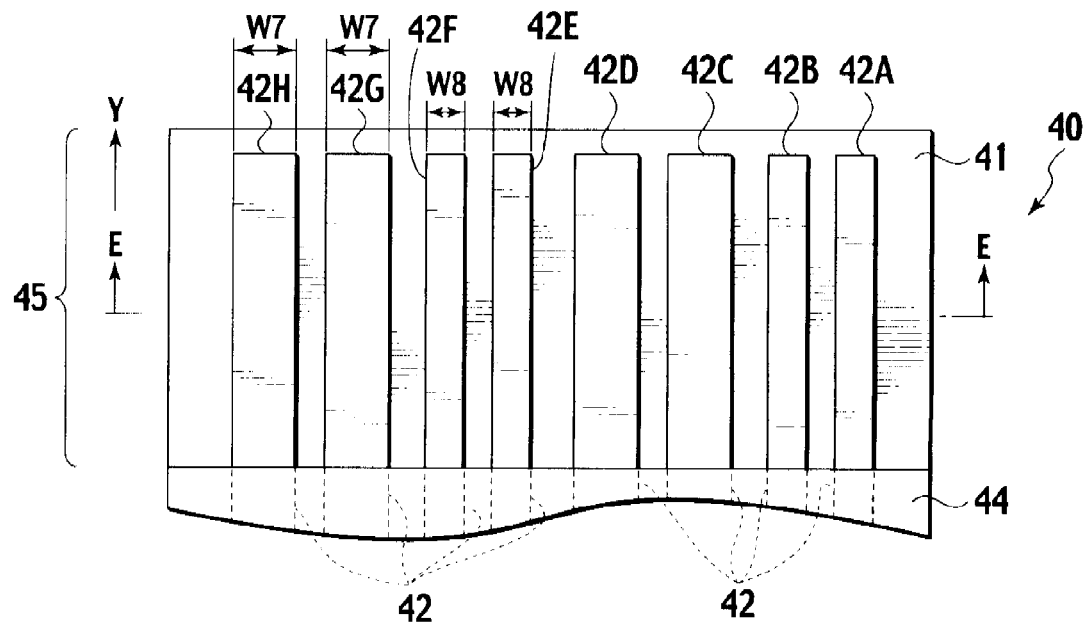
FIG. 13 is a plan view of a substantial portion of another connection configuration for a printed wiring board exemplified as another embodiment of the present invention.
Figure 14:
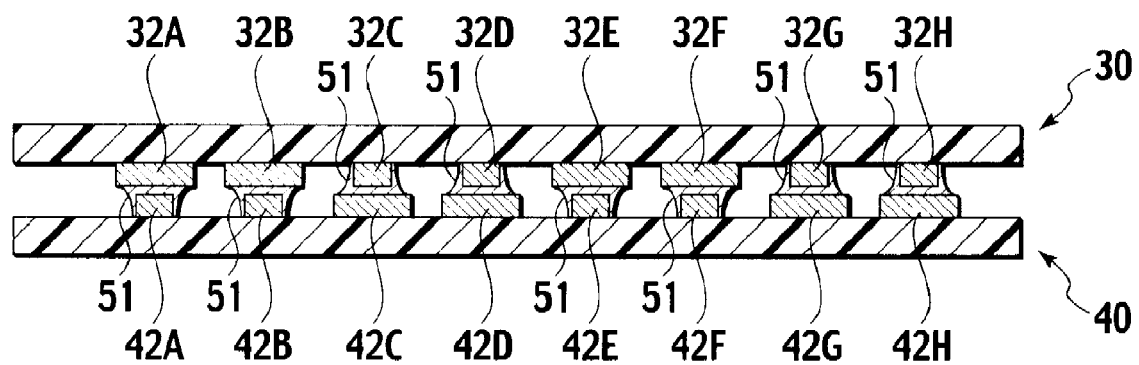
FIG. 14 is a cross-sectional view taken along a line E-E of another connection configuration for a printed wiring board exemplified as another embodiment of the present invention.

There will be described a specific non-limiting embodiment mentioned above, referring to FIGS. 12 to 14. FIG. 12 shows a printed wiring board 30 to be used in this another connection configuration as another embodiment of the present invention; FIG. 13 shows a printed wiring board 40 to connected with the printed wiring board 30; and FIG. 14 shows a cross-sectional view taken along a line E-E in FIGS. 12 and 13, given for explanation of the configuration after the printed wiring boards 30, 40 are soldered with each other.

The printed wiring board 30 shown in FIG. 12 is composed of an insulating base material 31, a plurality of wirings 32 formed so as to have a predetermined pattern on one surface of the insulating base material 31, and an adhesion layer (not shown) atop the wirings 32 and the insulating base material 31, and a resist layer (cover layer) 34 formed on the adhesion layer. In addition, the printed wiring board 30 has a connection area 35 in which connection terminal portions 32A to 32H, extending from the wirings 32, are exposed.

As shown in FIG. 12, the connection terminal portions 32A, 32B, 32E, 32F among those 32A to 32H are formed on the surface of the insulating base material 31 so as to have a fifth width W5 along a direction perpendicular to an extending direction Y of the connection terminal portions; and the connection terminal portions 32C, 32D, 32G, 32H are formed on the same surface so as to have a sixth width W6 narrower than the fifth width W5.

As shown in FIG. 13, the printed wiring board 40 is composed of an insulating base material 41, a plurality of wirings 42 formed so as to have a predetermined pattern on at least one surface of the insulating base material 41, and an adhesion layer (not shown) atop the wirings 42 formed and the insulating base material 41, and a resist layer (cover layer) 44 formed on the adhesion layer. In addition, the printed wiring board 40 has a connection area 45 in which connection terminal portions 42A to 42H extending from the wirings 42 are provided exposed.

As shown in FIG. 13, the connection terminal portions 42C, 42D, 42G, 42H among those 42A to 42H are formed on at least one surface of the insulating base material 41 so as to have a width W7 along a direction perpendicular to an extending direction Y of the connection terminal portions; and the connection terminal portions 42A, 42B, 42E, 42F are formed on the same surface so as to have a width W8 narrower than the width W7. In addition, in the printed wiring board 40, the connection terminal portions 42C, 42D, 42G, 42H having the width W7 are formed in a position opposing the connection terminal portions 32C, 32D, 32G, 32H to be connected therewith of the printed wiring board 30; and the connection terminal portions 42A, 42B, 42E, 42F having the width W8 are formed in a position opposing the connection terminal portions 32A, 32B, 32E, 32F. Here, the width W7 is equal to W5 and the width W6 is equal to W8.

In other words, this configuration shown in FIGS. 12 and 13 exemplifies where two wider connection terminal portions are formed alternately with two narrower connection terminal portions. By the way, the insulating base materials 41, 31 and the resist layers 35, 45 can be made of the same material used for the aforementioned insulating base material 11 and the resist layer 14, respectively.

In order to electrically connect the printed wiring board 30 with the printed wiring board 40 above mentioned, a plating solder layer is formed on a surface of at least one of the connection terminal areas 35, 45 as shown in FIG. 14, and thus soldering is carried out while applying a predetermined pressure at a predetermined temperature. FIG. 14 illustrates a connection configuration obtained by forming the plating solder layer on the surface of the connection terminal portion of the printed wiring board 30 and carrying out soldering with an application of a predetermined pressure at a predetermined temperature. This soldering allows for connection between the connection terminal portions 32A to 32H and the connection terminal portions 42A to 42H, respectively, thereby connecting the printed wiring board 30 and the printed wiring board 40.

As shown as the second non-limiting embodiment of the present invention, since two connection terminal portions having the wider width and two connection terminal portions having the narrower width are provided alternately with each other in connecting the printed wiring board 30 and the printed wiring board 40, such a configuration allows for fine structuring of the connection terminal portions in a differential communication line or the like. In addition, in the case of a high speed transmission line which requires the same wiring layout corresponding to each bus line, there is employed such a configuration in which a plurality of connection terminal portions having a wider width and a plurality of connection terminal portions having a narrower width are arranged alternately with each other. Namely, according to the second non-limiting embodiment of the present invention, a printed wiring board applied to a differential communication line or a high speed transmission line can enjoy an advantage of a reduced terminal separation and pitch.

Moreover, since the connection terminal portions 32A, 32B have a different width from the connection terminal portions 42A, 42B in the connection configuration shown in FIG. 14, there is formed a fillet 51 where the connection is made, the fillet 51 serving as a solder pool for redundant solder, thereby preventing a formation of a solder bridge and thus a short-circuit defect.

In the above embodiments, at least one of the pair of printed wiring boards can be a flexible printed wiring board having a predetermined flexibility. Additionally, two flexible printed wiring boards may be connected in the embodiments.

As an example of the printed wiring board described as one of the above non-limiting embodiments of the present invention, a connection configuration was realized in which a flexible substrate fabricated by forming a copper circuit pattern on an insulating base material made of polyimide resin and a rigid substrate fabricated by forming a copper circuit pattern on a glass epoxy base material were connected. Here, the flexible substrate corresponds to the printed wiring board 1 shown in FIG. 4 and the rigid substrate corresponds to the printed wiring board 10 shown in FIG. 5.

On the flexible substrate, a connection terminal portion having a terminal width of 80 µm and a connection terminal portion having a terminal width of 40 µm were formed alternately with each other. On the rigid substrate, a connection terminal portion having a terminal width of 40 µm was formed in a position opposing the connection terminal portion of 80 µm wide of the flexible substrate and a connection terminal portion having a terminal width of 80 µm was formed in a position opposing the connection terminal portion of 40 µm wide of the flexible substrate. In these substrates, an average pitch P of the terminals can be 100 µm.

Figure 3:
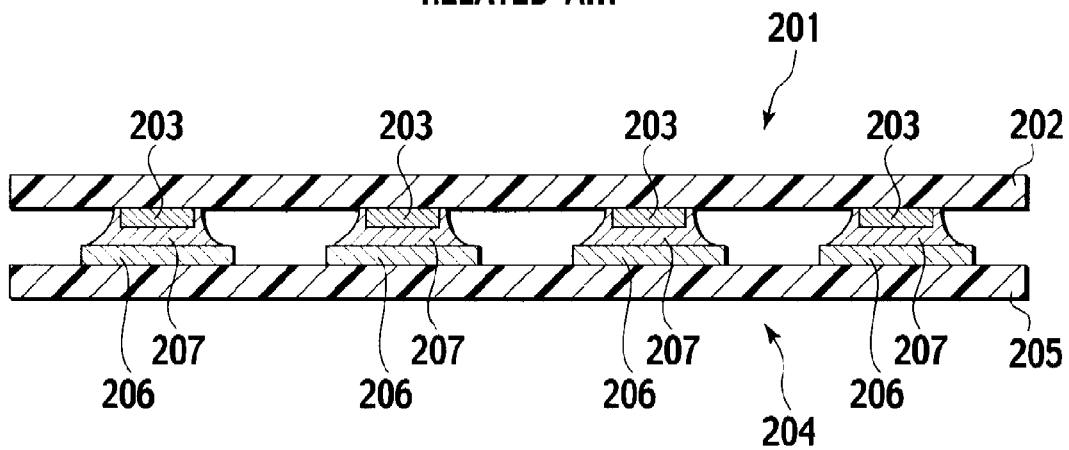
FIG. 3 is a vertical cross-sectional view of a related art printed wiring board.

By the way, assuming that the same arrangement dimension is realized in the related-art connection configuration described with reference to FIG. 3, the connection land 206 of the rigid substrate 204 is 80 µm; the connection land 203 of the flexible substrate 201 is 40 µm; and a separation between the connection lands would be 40 µm, which results in an average pitch of 120 µm between the terminals since the terminal separation in a connection portion is determined by a separation between the terminals having a wider connection land.

Therefore, it has been found that the connection configuration according to the non-limiting embodiments of the present invention can reduce the terminal pitch by 20 µm, which is rendered as about a 20% reduction of the connection portion.

Although the invention has been described in conjunction with the foregoing embodiments, many alterations and modifications will be apparent to those skilled in the art. Those alterations and modifications are intended to fall within the spirit and scope of the appended claims.

What is claimed is:

1. A connection configuration directed to connect printed wiring boards, comprising:
    a first printed wiring board including;
    a first insulating base material,
    a first wiring, including a plurality of first connection terminal portions and a plurality of second connection terminal portions, formed on a surface of the first insulating base material, the first wiring forming a predetermined circuit pattern,
    the first connection terminal portions each having a first width,
    the second connection terminal portions each having a second width that is smaller than the first width, and
    a first cover layer that covers at least a portion of the first wiring and exposes the first and the second connection terminal portions; and
    a second printed wiring board including;
    a second insulating base material,
    a second wiring, including a plurality of third connection terminal portions and a plurality of fourth connection terminal portions, formed on a surface of the second insulating base material, the second wiring forming a predetermined circuit pattern,
    the third connection terminal portions each having a third width and being formed so as to oppose the second connection terminal portions,
    the fourth connection terminal portions each having a fourth width that is smaller than the third width and being formed so as to oppose the first connection terminal portions, and
    a second cover layer that covers at least a portion of the second wiring and exposes the third and the fourth connection terminal portions;
    wherein each of the first connection terminal portions is connected to each of the fourth connection terminal portions, respectively,
    wherein each of the second connection terminal portions is connected to each of the third connection terminal portions, respectively,
    wherein the first width is substantially equal to the third width and the second width is substantially equal to the fourth width, and
    wherein the first connection terminal portions are formed alternately with the second connection terminal portions.

2. A connection configuration as recited in claim 1, wherein the first and the second connection terminal portions constitute an end portion of the first wiring.

3. A connection configuration as recited in claim 1, wherein the third and the fourth connection terminal portions constitute an end portion of the second wiring.

4. A connection configuration as recited in claim 1, wherein the first printed wiring board further comprises an additional one or more of the first wirings;
  wherein the first connection terminal portions are electrically connected to at least one of the first wirings; and
  wherein the second connection terminal portions are electrically connected to at least another one of the first wirings.

5. A connection configuration as recited in claim 4, wherein the first connection terminal portions constitute an end portion of the at least one of the first wirings and the second connection terminal portions constitute an end portion of the at least another one of the first wirings.

6. A connection configuration as recited in claim 1, wherein the second printed wiring board further comprises an additional one or more of the second wirings;
  wherein the third connection terminal portions are electrically connected to at least one of the second wirings; and
  wherein the fourth connection terminal portions are electrically connected to at least another one of the second wirings.

7. A connection configuration as recited in claim 6, wherein the third connection terminal portions constitute an end portion of the at least one of the second wirings and the fourth connection terminal portions constitute an end portion of the at least another one of the second wirings.

8. A connection configuration as recited in claim 1, wherein a connection between a respective first connection terminal portion and a respective fourth connection terminal portion is made with a solder layer provided therebetween and wherein a connection between a respective second connection terminal portion and a respective third connection terminal portion is made with a solder layer provided therebetween.

9. A connection configuration as recited in claim 1, wherein at least one of the first printed wiring board and the second printed wiring board has flexibility.

10. A connection configuration as recited in claim 1, wherein every two of the plurality of first connection terminal portions are formed alternately with every two of the plurality of second connection terminal portions, respectively.

11. The connection configuration according to claim 1, wherein the first and second cover layers are each formed of a resin material.

* * * * *